(12) United States Patent
Maruo

(10) Patent No.: US 6,683,307 B2
(45) Date of Patent: Jan. 27, 2004

(54) SCANNING TYPE CHARGED PARTICLE BEAM MICROSCOPE

(75) Inventor: Masayuki Maruo, Chiba (JP)

(73) Assignee: Seiko Instruments Inc., Chiba (JP)

( * ) Notice: Subject to any disclaimer, the term of this patent is extended or adjusted under 35 U.S.C. 154(b) by 138 days.

(21) Appl. No.: 09/910,109

(22) Filed: Jul. 20, 2001

(65) Prior Publication Data
US 2002/0017606 A1 Feb. 14, 2002

(30) Foreign Application Priority Data
Jul. 27, 2000 (JP) .......................... 2000-227379

(51) Int. Cl.[7] .................. G01N 23/00; G01N 21/00; G21K 7/00; G21K 5/10; A61N 5/00; G21G 5/00
(52) U.S. Cl. .................. 250/310; 250/307; 250/309; 250/311; 250/491.1; 250/492.1; 250/492.2; 250/492.21; 250/492.3
(58) Field of Search .................. 250/506, 309, 250/310, 311, 491.1, 306, 307, 396 R, 492.1, 492.2, 492.21, 492.3; 382/149

(56) References Cited

U.S. PATENT DOCUMENTS

| | | | | |
|---|---|---|---|---|
| 4,556,797 A | * | 12/1985 | Kuni et al. | 250/492.2 |
| 4,907,287 A | * | 3/1990 | Homma et al. | 382/255 |
| 5,874,735 A | * | 2/1999 | Matsumoto et al. | 250/310 |
| 6,509,564 B1 | * | 1/2003 | Suzuki et al. | 250/310 |
| 6,538,248 B1 | * | 3/2003 | Kametani et al. | 250/310 |
| 6,587,581 B1 | * | 7/2003 | Matsuyama et al. | 382/149 |

* cited by examiner

Primary Examiner—John R. Lee
Assistant Examiner—Mary El-Shammaa
(74) Attorney, Agent, or Firm—Adams & Wilks

(57) ABSTRACT

A scanning type charged particle beam microscope has a scanning signal generator for generating a scanning signal, a scanning device for scanning a surface of a sample to generate a scanned image of the surface of the sample in accordance with the scanning signal, and correcting device for correcting a shift of the scanned image. An image storing apparatus stores the scanned image after the shift of the scanned image has been corrected.

17 Claims, 4 Drawing Sheets

SCANNING TYPE CHARGED PARTICLE BEAM MICROSCOPE

BACKGROUND OF THE INVENTION

1. Field of the Invention

The present invention relates a scanning type charged particle beam microscope, such as a scanning electron microscope or a scanning ion microscope, and to a method of sampling a scanned image to a storing apparatus of the scanning type charged particle beam microscope.

2. Description of the Related Art

In a scanning type charged particle beam microscope, such as a scanning electron microscope or a scanning ion microscope, a secondary electron signal provided from a sample by a scanning signal is sampled to a storing apparatus in synchronism with the scanning signal to thereby constitute image data.

However, there is a delay of a signal in an electronic circuit and therefore, a scanning position of a charged particle beam and a storing position thereof to a storing apparatus are shifted from each other by an amount of delay time of the electronic circuit. Further, when the scanning speed is changed, there is a problem that at a fast scanning speed a storing position of a storing image is delayed in comparison to that at a slow scanning speed and a positional shift is produced in the image data. These problems exist because in the related art technology start of scanning and start of storing an image are carried out simultaneously with each other and, therefore, the scanning position and the storing position are shifted from each other by an amount of delay time of the electronic circuit. Further, the delay time of the electronic circuit is provided with a dispersion produced by a characteristic of an apparatus and, therefore, the delay time cannot be corrected uniquely.

SUMMARY OF THE INVENTION

In order to resolve the above-described problem, according to an aspect of the invention, when a timing signal such as a start signal of scanning is utilized as an image recording control signal, by delaying the signal by an amount of delay of an electronic circuit by using a shift register having a variable stage number, the delay of the electronic circuit is corrected to thereby prevent a positional shift of an image.

According to a scanning type charged particle beam microscope constituted as described above, a storing position is shifted from a scanning position by the amount of a delay time period of the electronic circuit and therefore, an operational position and the storing position coincide with each other. Further, when a stage number of the shift register having the variable stage number is adjusted while observing the image, delay time inherent to an apparatus can simply be adjusted.

DETAILED DESCRIPTION OF THE PREFERRED EMBODIMENTS

An explanation will be given of embodiments of the invention in reference to the drawings as follows.

Figure 1:
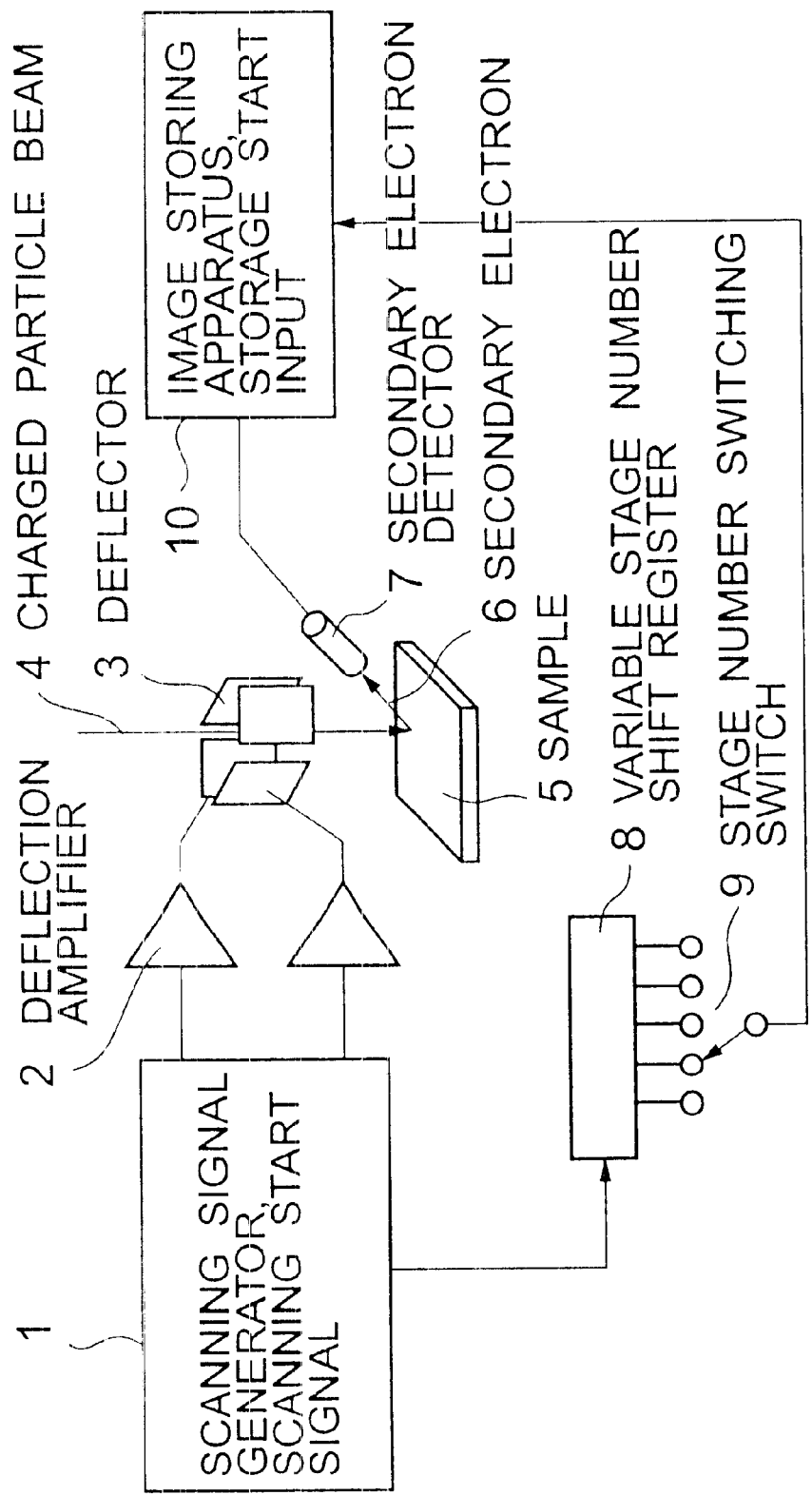
FIG. 1 is a simple constitution view of a scanning type charged particle beam microscope.
Figure 2:
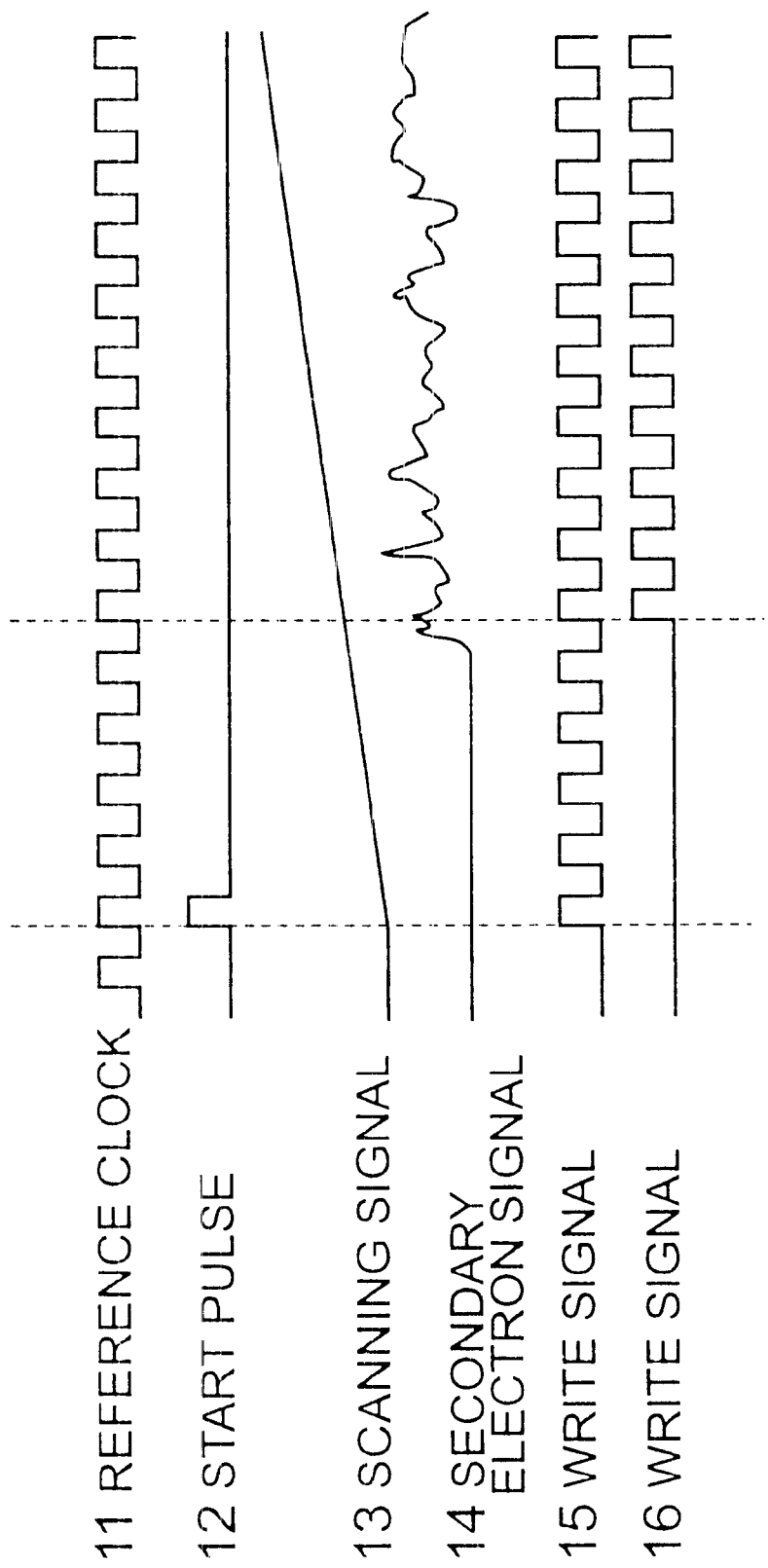
FIG. 2 is a signal timing chart showing operation of FIG. 1.

FIG. 1 shows an embodiment of a scanning type charged particle beam microscope according to the invention. An explanation will be given of the operation thereof with reference to a signal timing chart shown in FIG. 2.

A scanning signal generator 1 produces a start pulse 12 based on a referenced clock 11, generates a scanning signal 13 with the pulse as a reference, amplifies the signal by a magnitude necessary for a deflection amplifier 2, deflects a charged particle beam 4 by a deflector 3 and scans a surface of a sample 5. Secondary electron 6 having an amount in accordance with a shape or properties thereof is generated from the surface of the sample 5 and therefore, the secondary electron 6 is detected by a secondary electron detector 7 to thereby provide a secondary electron signal 14. As is apparent from FIG. 2, the secondary electron signal 14 is delayed from the scanning signal 13 owing to delay of an electronic circuit thereof.

The start pulse 12 produced by the scanning signal generator 1 is delayed based on the reference clock 11 by a stage number designated by a stage number switching switch 9 by a variable stage number shift register 8 and supplied to a storage start input of an image storing apparatus 10.

The image storing apparatus 10 generates a write signal 16 according to the invention when the image storing apparatus 10 is provided with a storage start signal which is delayed based on the reference clock 11 by the stage number designated by the stage number switching switch 9 by the variable stage number shift register 8 and stores the secondary electron signal 14 based thereon at a storing apparatus at inside thereof. The stored data is displayed by a display apparatus or utilized in image processing by a computer.

According to the related art apparatus, the secondary electron signal 14 is stored at a storing apparatus at inside thereof based on a write signal 15 of the related art apparatus.

When the apparatus according to the invention is compared with the conventional apparatus, it is the feature of the invention that with regard to data stored to the storing apparatus, data at start time point of the scanning signal 13 and data at storage start point, substantially coincide with each other. Further, the delay time of the electronic circuit shows a characteristic inherent to the apparatus and therefore, when the delay time is corrected, the delay time can simply be corrected by switching the stage number of the variable stage number shift register 8.

Figure 3:
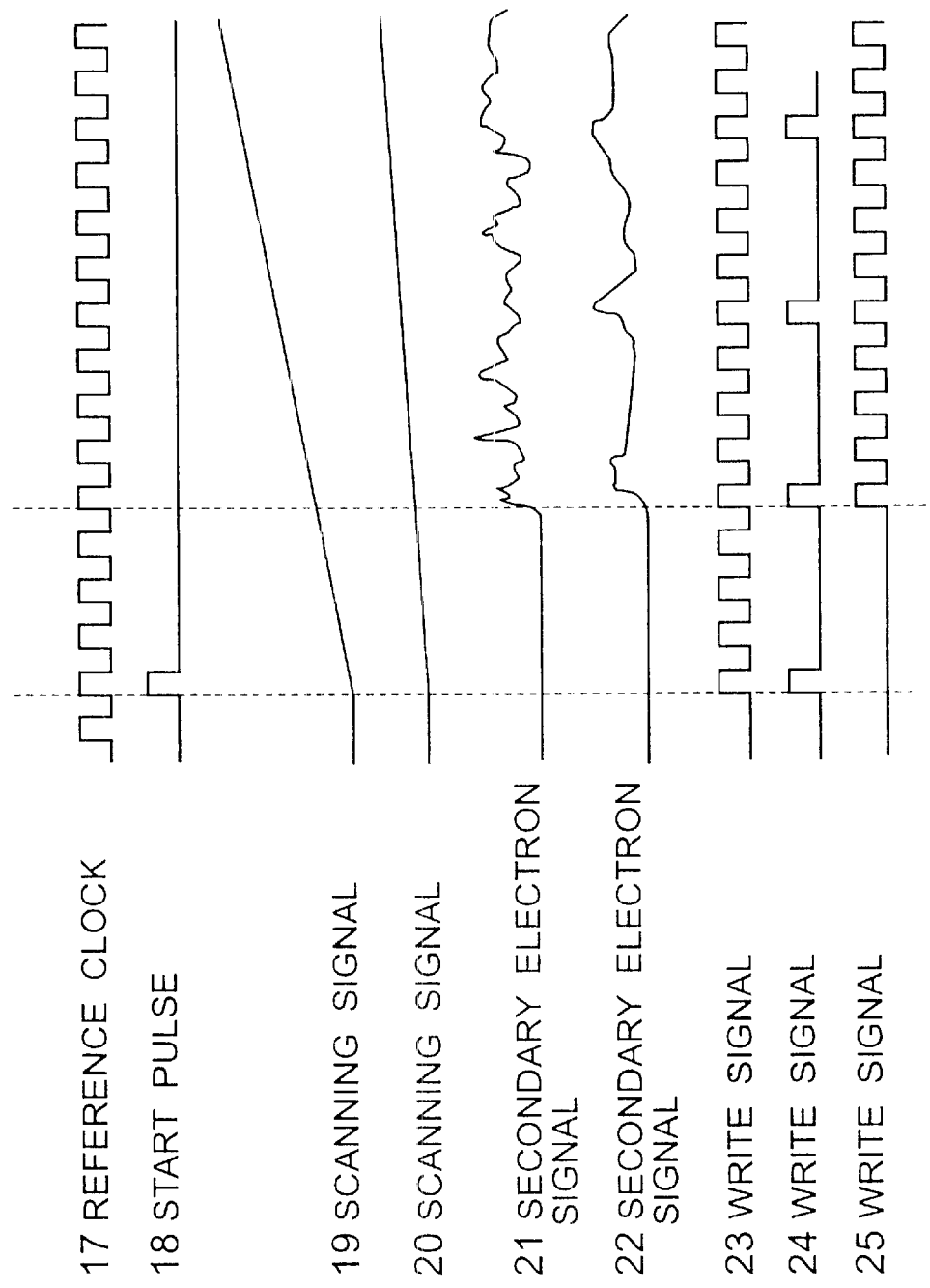
FIG. 3 is a signal timing chart in adjusting an electronic circuit.

FIG. 3 shows a method of adjusting correction of delay time of an electronic circuit according to the invention. Scanning signals 19 and 20, secondary electron signals 21 and 22 and write signals 23 and 24 in the case of high-speed scanning and in the case of low-speed scanning, are shown to align for comparison. A difference of speed in the both cases is caused by a multiplication factor of four in this example. According to the variable stage number shift register, the stage number is switched by 0, that is, without delay. Generally, the delay of the electronic circuit shows a substantially constant value without being dependent on the scanning speed and therefore, according to the example, data stored to the image storing apparatus becomes effective from a fifth pixel in the case of high-speed scanning and from a second pixel in the case of low-speed scanning.

When the delay is adjusted, adjustment can simply be carried out by correcting a position of an image provided in high-speed scanning while switching the stage number of the variable stage number shift register in the high-speed scanning to coincide with an image provided in low-speed scanning when the correction is 0. In this example, the delay may be set to four stages (4 clocks).

Figure 4:
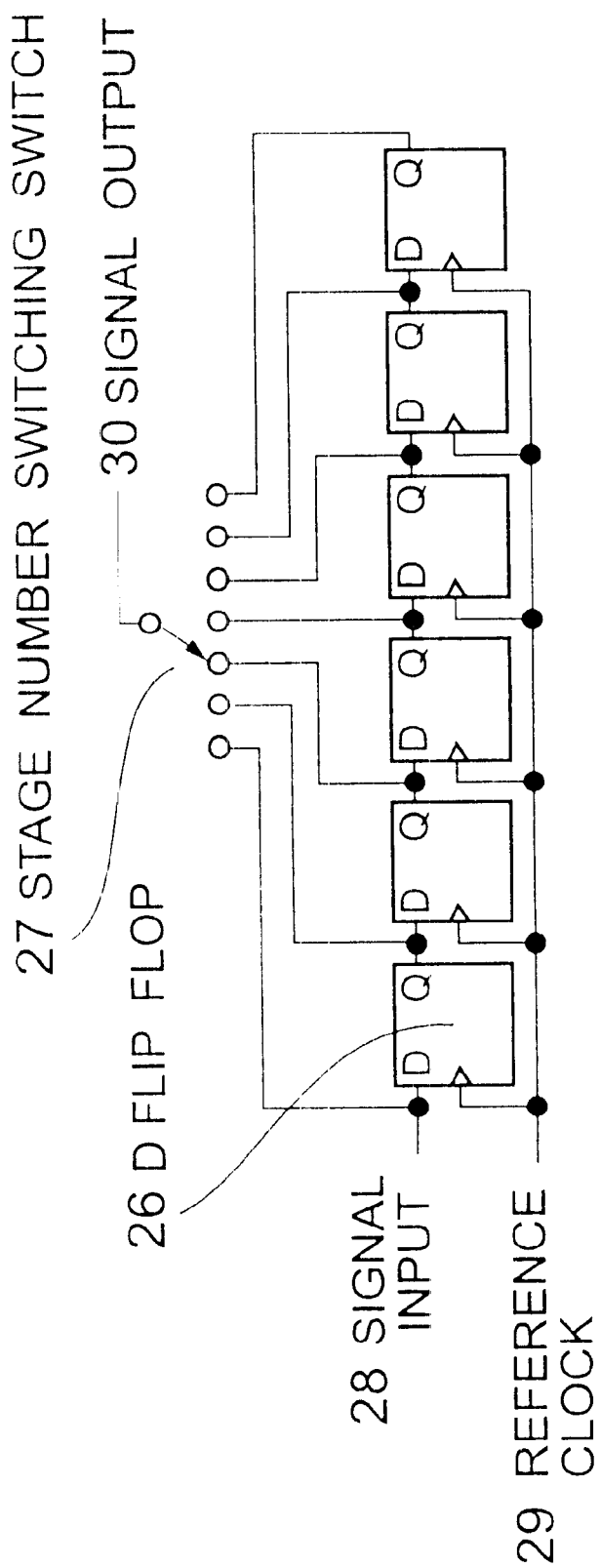
FIG. 4 is a constitution diagram of a shift register having a variable stage number defined by the invention.

FIG. 4 is a constitution example of the variable stage number shift register defined by the invention. A plurality of D flip flop 26 connecting outputs and inputs thereof are aligned in series and driven by a reference clock 29. An output of the respective flip flop is connected to respective tap of a stage number switching switch 27 and the stage number can be selected. A signal provided to a signal input 28 appears at a signal output 30 by being delayed by a period of the reference clock 29 multiplied by the stage number of selected ones of the D flip flop 26.

Although according to the embodiment, stage switching is represented by simple switches, an element such as a digital multiplexor can naturally be used. Further, although according to the invention, the storage start signal is delayed, the delay can similarly be realized by delaying a signal such as the write signal.

The scanning type charged particle beam microscope according to the invention is constructed by the constitution in which shift of a scanning image caused by a delay of an electronic circuit is corrected by delaying a timing of sampling a signal to a storing apparatus by an amount of delay of the electronic circuit by using a shift register having a variable stage number and therefore, an effect described below can be achieved.

(1) The secondary electron information is stored to the storing apparatus after correcting the delay of the electronic circuit and therefore, the scanning position and the storing position of a storing apparatus of the charged particle beam coincide with each other.

(2) The delay time can simply be corrected by observing an actual image.

What is claimed is:

1. A scanning type charged particle beam microscope comprising:

a scanning signal generator for generating a scanning signal;

scanning means for scanning a surface of a sample to generate a scanned image of the surface of the sample in accordance with the scanning signal;

correcting means for correcting a shift of the scanned image produced by a delay in an electronic circuit of the scanning type charged particle beam microscope; and an image storing apparatus for storing the scanned image after the shift of the scanned image has been corrected.

2. A scanning type charged particle beam microscope according to claim 1, wherein the correcting means comprises a shift register having a variable stage number.

3. A scanning type charged particle beam microscope according to claim 1; wherein the correcting means includes means for correcting a shift of the scanned image due to a difference in scanning speed during scanning of the surface of the sample by the scanning means.

4. A scanning type charged particle beam microscope according to claim 3; wherein the correcting means comprises a shift register having a variable stage number for correcting the shift of the scanned image by switching a stage number of the shift register.

5. A scanning type charged particle beam microscope comprising:

scanning means for scanning a surface of a sample with an electron beam to generate an electron signal;

correcting means for correcting a shift in the electron signal produced by a delay in an electronic circuit of the scanning type charged particle beam microscope; and storing means for storing the electron signal after correction of the shift in the electron signal by the correcting means.

6. A scanning type charged particle beam microscope according to claim 5; wherein the correcting means comprises a shift register having a variable stage number.

7. A scanning type charged particle beam microscope according to claim 5; wherein the correcting means includes means for correcting a shift in the electron signal due to a difference in scanning speed during scanning of the surface of the sample by the scanning means.

8. A scanning type charged particle beam microscope according to claim 7; wherein the correcting means comprises a shift register having a variable stage number for correcting the shift in the electron signal by switching a stage number of the shift register.

9. A scanning type charged particle beam microscope comprising:

a scanning signal generator for generating a scanning signal;

scanning means for scanning a charged particle beam over a surface of a sample to generate a secondary electron beam;

detecting means for detecting the secondary electron beam and outputting a corresponding secondary electron signal;

correcting means for correcting a shift in the secondary electron signal produced by a delay in an electronic circuit of the scanning type charged particle beam microscope; and storing means for storing the secondary electron signal after correction of the shift in the secondary electron signal by the correcting means.

10. A scanning type charged particle beam microscope according to claim 9; wherein the correcting means comprises a shift register having a variable stage number.

11. A scanning type charged particle beam microscope according to claim 9; wherein the correcting means comprises a shift register having a variable stage number for correcting the shift in the secondary electron signal by switching a stage number of the shift register.

12. A scanning type charged particle beam microscope according to claim 9; wherein the correcting means includes means for correcting a shift in the secondary electron signal due to a difference in scanning speed during scanning of the surface of the sample by the scanning means.

13. A scanning type charged particle beam microscope according to claim 12; wherein the correcting means comprises a shift register having a variable stage number for correcting the shift in the secondary electron signal by switching a stage number of the shift register.

14. A scanning type charged particle beam microscope according to claim 9; wherein the scanning means comprises a deflector for deflecting the charged particle beam toward the surface of the sample.

15. A scanning type charged particle beam microscope according to claim 9; wherein the correcting means comprises a shift register having a variable stage number for correcting the shift in the secondary electron signal by switching a stage number of the shift register.

16. A scanning type charged particle beam microscope according to claim 9; further comprising an amplifier for amplifying the scanning signal generated by the scanning signal generator.

17. A scanning type charged particle beam microscope according to claim 16; wherein the scanning means comprises a deflector for deflecting the charged particle beam toward the surface of the sample.

* * * * *